United States Patent
Teng

(12) 
(10) Patent No.: US 6,351,840 B1
(45) Date of Patent: Feb. 26, 2002

(54) METHOD FOR BALANCING A CLOCK TREE

(75) Inventor: Chin-Chi Teng, Sunnyvale, CA (US)

(73) Assignee: Silicon Perspective Corporation, Santa Clara, CA (US)

( * ) Notice: Subject to any disclaimer, the term of this patent is extended or adjusted under 35 U.S.C. 154(b) by 0 days.

(21) Appl. No.: 09/458,505

(22) Filed: Dec. 9, 1999

(51) Int. Cl.[7] .............................................. G06F 17/50
(52) U.S. Cl. ...................... 716/7; 716/2; 716/8; 716/9; 716/10
(58) Field of Search ............................................. 716/7

(56) References Cited

U.S. PATENT DOCUMENTS

| | | | | |
|---|---|---|---|---|
| 5,410,491 A | * | 4/1995 | Minami | 716/6 |
| 5,557,779 A | * | 9/1996 | Minami | 716/6 |
| 5,860,108 A | * | 1/1999 | Horikawa | 711/141 |
| 5,866,924 A | * | 2/1999 | Zhu | 257/208 |
| 5,983,224 A | * | 11/1999 | Singh et al. | 707/6 |
| 6,006,025 A | * | 12/1999 | Cook et al. | 716/14 |
| 6,286,128 B1 | * | 9/2001 | Pileggi et al. | 716/18 |
| 2001/0010090 | * | 7/2001 | Boyle et al. | 716/2 |
| 2001/0011776 | * | 8/2001 | Igarashi et al. | 257/776 |

OTHER PUBLICATIONS

A.D. Mehta et al., Clustering and Load Balancing for Buffered Tree Synthesis, 1997 IEEE International Conference on Computer Design: VLSI in Computers and Processors, Oct. 12, 1997, pp. 217–223.*

* cited by examiner

Primary Examiner—Matthew Smith
Assistant Examiner—A. M. Thompson
(74) Attorney, Agent, or Firm—Daniel J. Bedell; Smith-Hill and Bedell

(57) ABSTRACT

In an integrated circuit (IC) design, a set of K×N clocked IC devices ("syncs") such as flip-flops and latches are organized into K clusters of N syncs each, with each cluster being clocked by a separate clock tree buffer. An improvement to a conventional "K-center" method for assigning syncs to clusters is disclosed. The improved method, which reduces the separation between syncs within the clusters, initially employs the conventional K-center method to preliminarily assign the K×N syncs to K clusters having N syncs per cluster. The improved method thereafter ascertains boundaries of rectangular areas of the IC occupied by the separate clusters. When areas of any group of M>1 clusters overlap, the K-center meth is repeated to reassign the set of M×N syncs included in e M overlapping clusters to a new set of M clusters. The new set of M clusters are less likely to overlap.

10 Claims, 5 Drawing Sheets

METHOD FOR BALANCING A CLOCK TREE

BACKGROUND OF THE INVENTION

1. Field of the Invention

The present invention relates in general to methods for designing integrated circuits (ICs) and in particular to a method for assigning clocked circuit devices of an IC into clusters to be clocked by a balanced clock tree.

2. Description of Related Art

Figure 1:
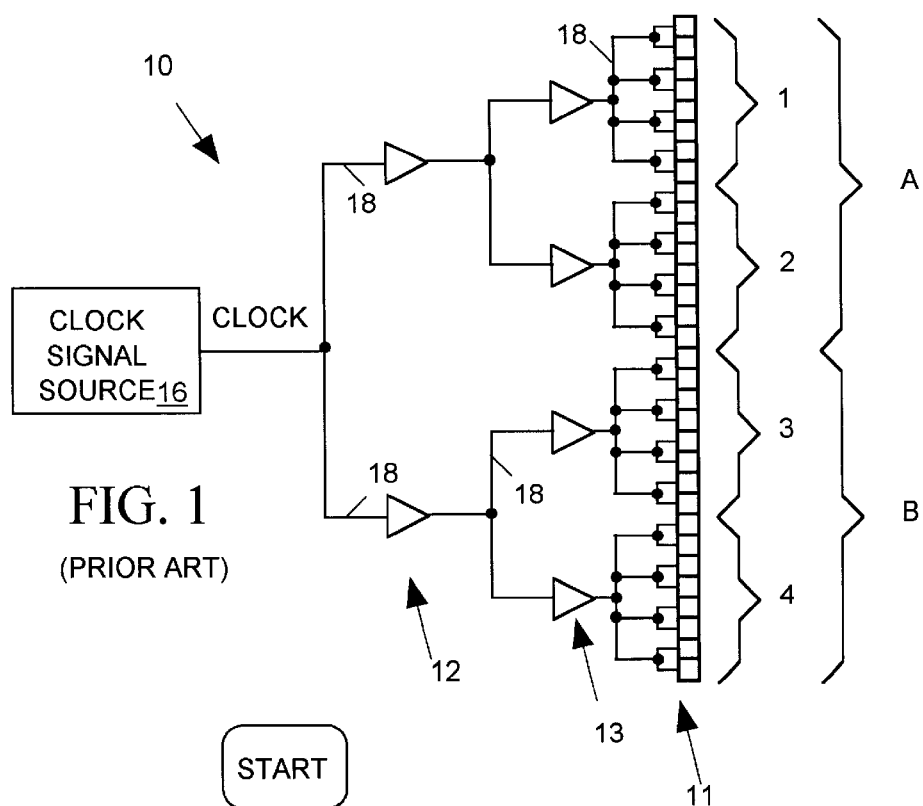

A digital IC typically employs many flip-flops, latches and other circuit devices ("syncs") that are periodically clocked by edges of a clock signal distributed to all such syncs. Since an IC circuit typically has a very large number (thousands or millions) of syncs, a single clock signal driver normally cannot directly supply a clock signal to all such syncs. Instead an IC typically includes a "clock tree" consisting of a set of buffers arranged in a tree-like network as illustrated in FIG. 1 that fans out a clock signal (CLOCK) so that no one buffer has to drive more than a relatively few syncs.

To ensure proper synchronization between the various parts of the circuit, each clock signal edge should reach all synchronization points at substantially the same time. Thus the time required for a clock signal edge to travel from its source to any sync should be substantially the same for all paths it follows through the clock tree. The time required for a clock signal edge to work its way through the tree from its source to a sync depends on many factors including the lengths of the conductors in the path, the number of buffers the edge must pass through, the switching delay of each buffer, the amount of attenuation of the clock signal incurs between buffer stages, and the load each buffer must drive. Accordingly designers try to "balance" the clock tree by ensuring that all clock signal paths between any two tree levels are of substantially similar length and impedance, by ensuring that all buffers at any level of the tree drive the same number of buffers or syncs at the next level of the tree, and by ensuring that all buffers on any given level have similar characteristics.

To balance the load on buffers forming a clock tree, designers group syncs into a set of "clusters" with each cluster including a similar number of syncs. The clock tree is then designed so that all syncs of a given cluster are clocked by the output of the same clock tree buffer, but wherein each cluster is clocked by the output of a separate clock tree buffer. To minimize variation in clock signal path lengths from a clock tree buffer to the syncs of a cluster that it clocks, designers would like to group syncs into clusters in a way that minimizes the separation between syncs within each cluster. When an IC includes thousands of syncs it is not practical for a designer to manually determine how to organize the syncs into clusters; computer-aided design (CAD) software typically does this automatically.

One widely employed algorithm for organizing clock tree called the "K-center" algorithm organizes a set of K×N syncs into a set of K clusters of N syncs each. The K-center algorithm randomly chooses a first sync to be the "center" of a first cluster. A second sync, the sync most distant from the first sync, is chosen to be the center of a second cluster. A third sync, the sync most remote from the first and second syncs, is then assigned as the center of a third cluster. When the process is repeated until a separate sync is assigned as the center of each of K clusters, the K cluster centers are widely distributed over the surface of the IC. Each of the remaining K(N−1) syncs are then preliminarily assigned to the cluster of the nearest center. Since syncs are often unevenly distributed on an IC, some of the clusters will typically contain more than N syncs while other clusters will contain fewer than N syncs. To balance the number of syncs per cluster, syncs most distant from the center of each cluster containing too many syncs are successively reassigned to nearest clusters containing too few syncs.

In this way the syncs are organized into a balanced set of K clusters with each cluster including N syncs. However the syncs the K-center method assigns to many clusters will often not be as tightly grouped as possible. An increase in distances between syncs of a cluster leads to increased variation in clock signal paths to those syncs and therefore reduced accuracy in synchronizing logic operations. When we reduce the synchronization accuracy we limit the frequency at which the IC can be operated.

What is needed is an improved method for organizing syncs into clusters that provides tightly packed clusters to minimize distances between syncs within each cluster.

SUMMARY OF THE INVENTION

The present invention is an improvement to the prior art K-center method for assigning a set of K×N clocked circuit devices ("syncs") on an IC to a set of K clusters with N syncs per cluster so that they may be clocked by a balanced clock tree.

In accordance with the invention, after employing the conventional K-center method to assign the K×N syncs to K clusters with N syncs per cluster, positions of syncs within each cluster are investigated to determine the boundaries of a rectangular area of the IC containing all the syncs of the cluster. With the boundaries of all clusters determined, the IC areas occupied by all clusters are then compared to determine whether any of these areas overlap. When any group of M>1 clusters is found to overlap, the cluster assignments for the M×N syncs within that group of M clusters are abandoned and the K-center method is used to reassign that set of M×N syncs to a new set of M clusters. The new set of M clusters is likely to have less overlapping. When any subset of the new set of M clusters is found to have overlapping areas, the K-center method is applied to the subset. Similarly the K-center method is applied iteratively until all cluster overlapping is eliminated or until application of the K-center method fails to effect further change in cluster assignments. This iterative, multipass application of the K-center method will typically produce more tightly grouped clusters than the prior art single pass application of the K-center algorithm.

Accordingly it is an object of the invention to provide a method for assigning syncs within an IC to a balanced set of tightly packed clusters.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
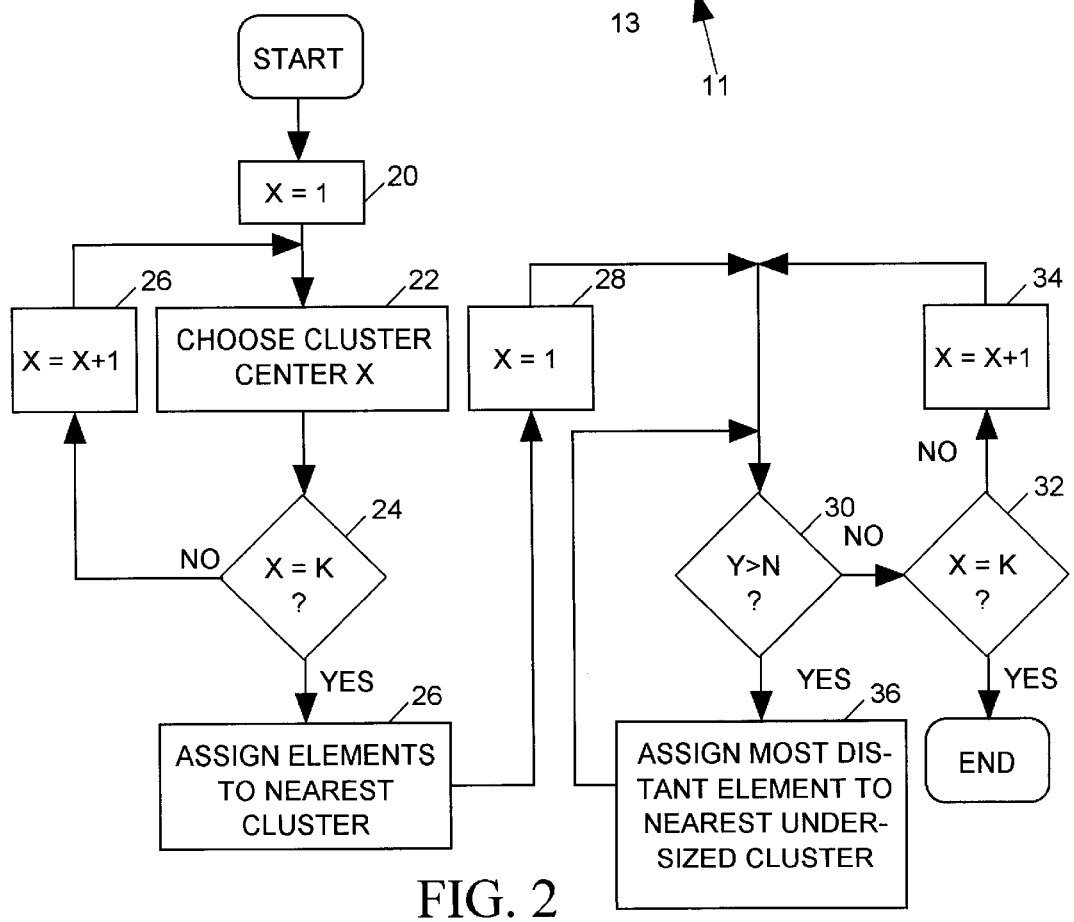
Figure 3:
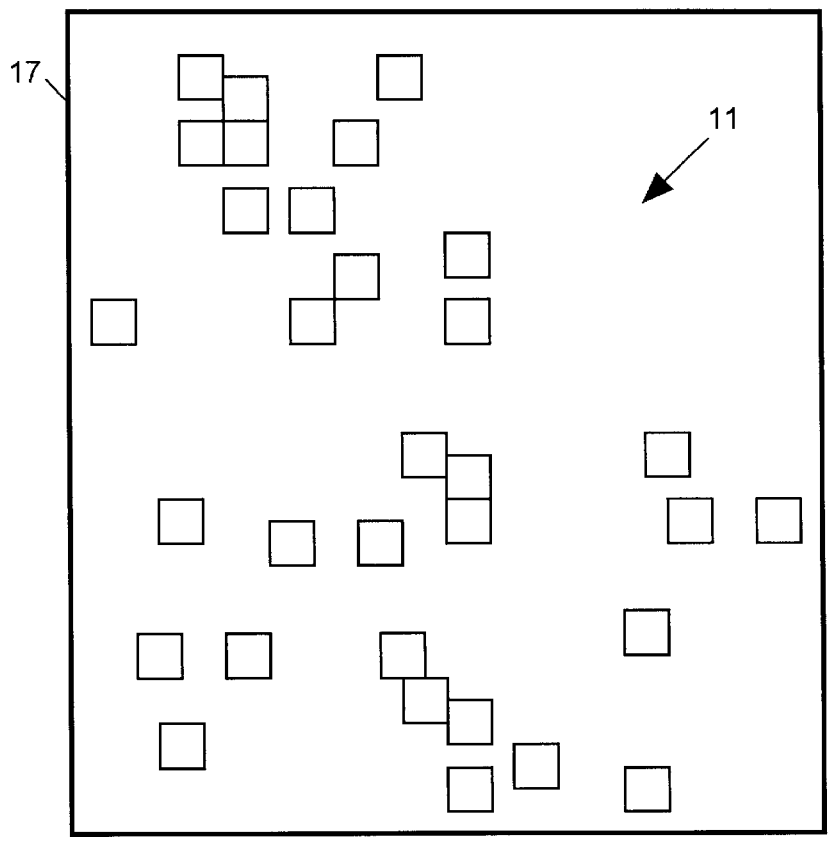
Figure 4:
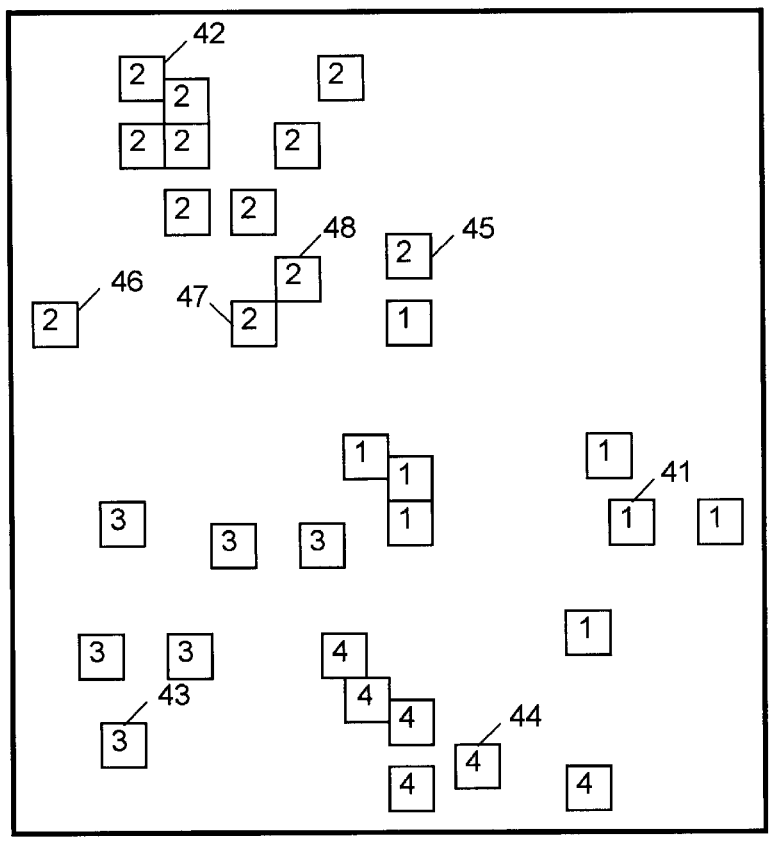
Figure 5:
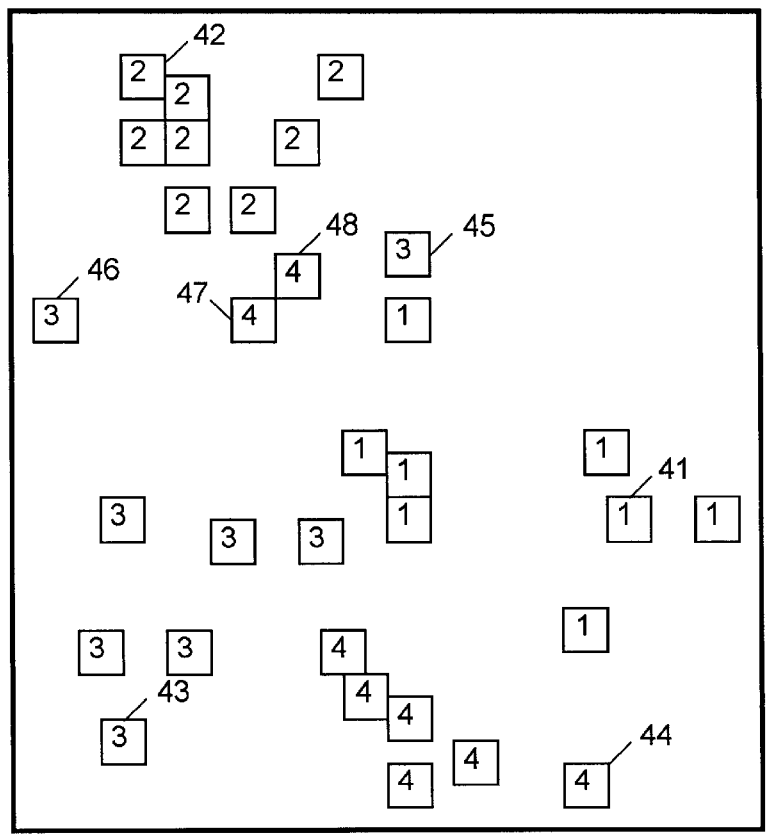
Figure 6:
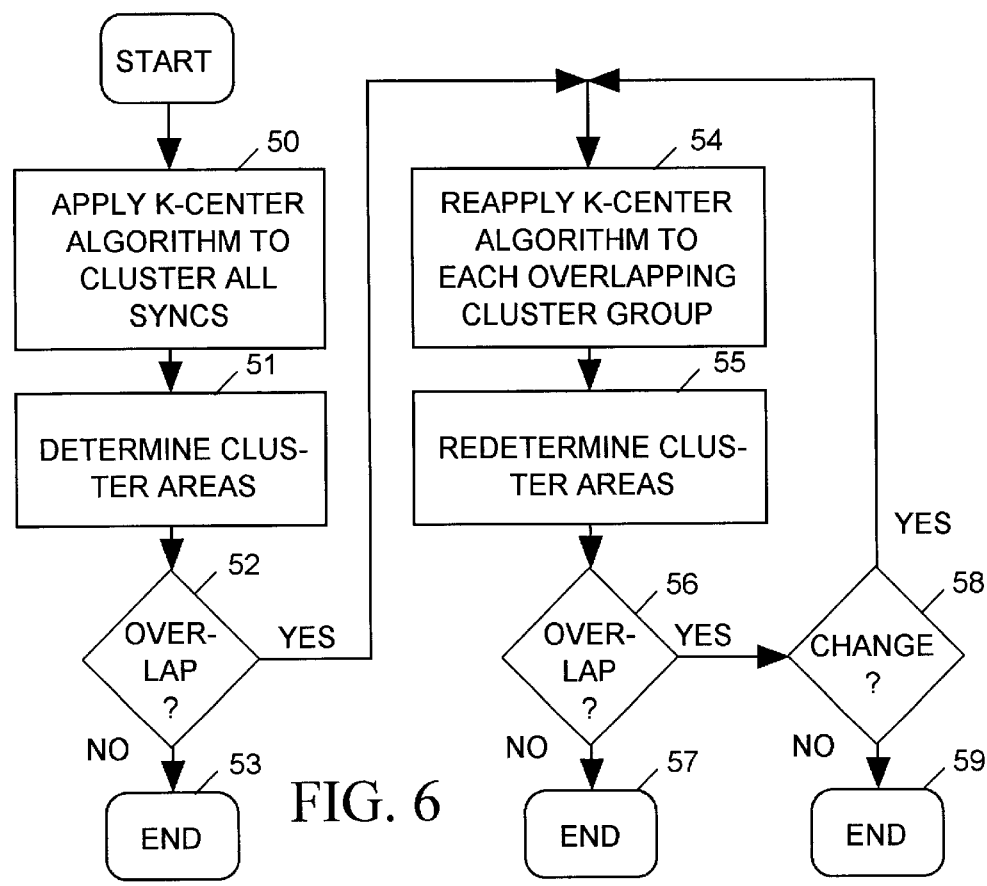

FIG. 1 illustrates a prior art integrated circuit clock tree in block diagram form, FIG. 2 illustrates in flow chart form a prior art "K-center" algorithm for assigning clocked circuit devices ("syncs") of an integrated circuit (IC) to a set of clusters, FIGS. 3–5 are simplified plan views of an IC containing the syncs of FIG. 2 illustrating application of the K-center algorithm of FIG. 2, FIG. 6 illustrates in flow chart form an improved algorithm in accordance with the invention for assigning the syncs of FIG. 3 a set of clusters, and FIGS. 7–10 are simplified plan views of the IC containing the syncs of FIG. 2 illustrating application of the improved algorithm of FIG. 6.

DESCRIPTION OF THE PREFERRED EMBODIMENT(S)

Clock Tree Architecture

FIG. 1 is a block diagram of a typical prior art "clock tree" 10 implemented in an integrated circuit (IC) to provide a common clock signal (CLOCK) input to a number of circuit devices ("syncs") 11 such as flip-flops or latches. For simplicity FIG. 1 shows only 32 such syncs 11 but a large digital integrated circuit may have many thousands of such syncs. Since a single clock signal source 16 normally cannot drive a large number of syncs, clock tree 10 includes an array of buffers 12, 13 fanning out the CLOCK signal to spread the load over many buffers. In this simple example, two first stage buffers 12 fan the CLOCK signal out to four second stage buffers 13 which in turn fan the CLOCK signal out to the 32 syncs 11. The number of buffer stages, the number of buffers per stage and the number of buffers or syncs each buffer drives are matters of design choice that depend on such factors as the load capacity of the buffers forming clock tree 10, input impedance of the devices they drive, path impedances and allowable signal attenuation between stages.

Clock tree 10 should be designed to provide CLOCK signal edges to all syncs 11 concurrently (or as nearly so as possible) in order to closely synchronize the logic operations the syncs carry out. Thus the CLOCK signal path delay between the clock signal source 16 and each sync 11 should be substantially uniform. Two factors influence the CLOCK signal path delay. First, each buffer the CLOCK signal passes through has an inherent switching delay between the time a CLOCK signal edge arrives at its input and the time the CLOCK signal edge departs its output. Second, of the conductors 18 interconnecting clock signal source 16, buffers 12, 13 and syncs 11 has an inherent path delay. The path delay is influenced by the length of the conductor and the conductor's impedance characteristics. As a CLOCK signal travels along a conductor 18 its impedance attenuates the CLOCK signal increasing the rise or fall time of its edges. A CLOCK signal edge input to one of buffers 12, 13 must rise or fall to a certain threshold logic level in order to switch on or off transistors forming the buffer. By increasing the rise or fall time of CLOCK signal edges, the impedance of conductors 18 delays state changes in the CLOCK signal.

To ensure that the CLOCK signal path delay between clock signal source 16 and all syncs 11 are uniform, IC designers use similar buffers 12, 13 within a each stage of clock tree 10 so that the inherent buffer switching delay is the same for all buffers of the stage. IC designers also try to balance the load on all clock tree buffers of a given stage so that each buffer of the stage drives approximately the same number of syncs or next stage buffers. IC designers also try to lay out the signal paths between any two clock tree stages so that they are substantially similar in length and impedance.

The present invention relates to the process of designing a clock tree for an IC, and in particular to an improvement to a prior art method for organizing syncs 11 of the IC into a hierarchical set of "clusters" corresponding to the hierarchical buffer stage structure of a clock tree. For example since clock tree 10 of FIG. 1 has two stages of buffers 12, 13, then syncs 11 are organized into a two-tier cluster hierarchy. All syncs 11 are included in one of two first tier clusters A and B of the hierarchy because all syncs 11 are (indirectly) driven one of two first stage buffers 12 of clock tree 10. Each sync 11 is also assigned to one of four second tier clusters 1–4, each corresponding to a particular second stage buffer 13 in the sync's CLOCK signal path.

To design a clock tree, designers first determine how many syncs 11 are to be clocked. That information, together with knowledge about the fan out capacity of the buffers to be used in each stage of the clock tree, helps the designer to determine how many stages the tree needs and how many buffers to use in each stage. The designer can then determine how many top tier clusters are needed and how many syncs are to be assigned to each top tier cluster. The present invention relates in particular to the next step of the clock tree design process, determining how to assign syncs 11 to clusters. Since designers want to make CLOCK path lengths relatively uniform, they like to keep cluster areas small to minimize the variation in clock signal path lengths between a buffer supplying a clock signal to the syncs of a cluster and each sync of the cluster. Thus designers like to group neighboring syncs 11 into the same top level cluster, to group neighboring top level clusters into next lower level clusters, etc. However since syncs are often distributed on an IC in an uneven pattern it is often difficult to determine how to best assign syncs into clusters, particularly when an IC has thousands of syncs.

K-center Algorithm

The present invention relates to an improvement to a prior art cluster assignment algorithm known as the "K-center" algorithm. The K-center algorithm organizes K×N syncs into K clusters with N syncs per cluster. For example for the clock tree structure of FIG. 1, the K-center algorithm would organize the K×N=32 syncs into four top (second) tier clusters 1–4 of eight syncs each.

FIG. 2 is a flow chart illustrating the prior art K-center algorithm. FIG. 3 is a simplified plan view of an IC 17 having 32 syncs 11 distributed as shown. FIGS. 4 and 5 are plan views of IC 17 of FIG. 3 illustrating preliminary and final cluster assignment plans the K-center algorithm produces. Starting at step 20 (FIG. 2), the algorithm sets a variable X (representing a cluster number) equal to 1 and then (step 22) randomly picks one of syncs 11 to be the "center" of cluster X. (A cluster "center" is simply the first sync assigned to a cluster and is not necessarily located at the physical center of a cluster.) In this example, the algorithm has randomly selected sync 41 (FIG. 4) as the center of cluster 1. For illustrative purposes sync 41 of FIG. 4 is marked with a "1" to indicate the algorithm has assigned it to cluster 1.

If X is not equal to K, the total number of clusters to be assigned (step 24), the algorithm increments X (step 26) and returns to step 22 to choose another sync 11 as the center of cluster X=2. To ensure clusters 1 and 2 are widely separated, the algorithm chooses as the center of cluster 2 the sync 42 that is most distant from sync 41, the center of cluster 1. Since X is not yet equal to K (step 24), X is again incremented to 3 (step 26) and the algorithm returns again to step 22 to choose the center of cluster 3. Sync 43 is chosen as the center of cluster 3 because it is most distant from all previously selected cluster centers 41 and 42. The algorithm then loops though steps 24, 26 and 22 once again to choose sync 44 as the center of cluster 4. Sync 44 was chosen because it is most distant from a nearest previously selected cluster center 41, 42 or 43. When the algorithm reaches step 24 for the fourth time, it finds that X=K=4 and therefor moves on to step 26 where it assigns each unassigned sync 11 to the cluster of its nearest cluster center. FIG. 4 illustrates this cluster assignment by marking each sync 11 with the number 1–4 of the cluster to which it has been assigned.

At this point each sync has been preliminary assigned to a cluster, but the clusters are not balanced in size; cluster 1 has eight syncs, cluster 2 has twelve syncs, clusters 3 and 4 have six each. We want each cluster to include N=8 syncs. To balance the clusters, the algorithm removes syncs from clusters that contain too many syncs (more than N=8) and inserts them in neighboring clusters containing too few syncs (less than 8). The algorithm counts the syncs of each cluster in turn and if a cluster has too many syncs it reassigns the syncs most distant from its cluster center to the nearest cluster having too few syncs.

Accordingly the K-center algorithm of FIG. 2 next resets cluster number variable X to 1 (step 28) and determines whether it needs to move syncs out of cluster X (step 30). Since cluster X=1 has Y=8 syncs, which is not greater than N=8 (the desired number of syncs per cluster), the algorithm does not remove any syncs from cluster 1 at step 30. Since X is not equal to K (step 32) the algorithm increments X to 2 (step 34) and checks the number of syncs in cluster X=2. Since cluster 2 has Y=12 syncs (step 30), the algorithm reassigns the cluster 2 sync 45 most distant from cluster 2 center 42 to the nearest undersized neighboring cluster 3 (step 36). The "nearest" undersized cluster is cluster 3 because its cluster center 43 is nearest the sync 45 being reassigned. FIG. 5 shows sync 45 as having been reassigned to cluster 3. After reassigning sync 45 at step 36, the algorithm loops back to step 30. Since the number Y of syncs in cluster 2 is now 11 which is still greater than N=8, the algorithm again moves to step 36 where it now reassigns sync 46 to cluster 3.

The process continues to loop through steps 30 and 36 reassigning next most distant cluster 2 syncs 46 and 47. Since cluster 3 now has 8 syncs, the nearest undersized cluster is cluster 4. FIG. 5 therefore shows syncs 46 and 47 as being reassigned to cluster 4. When at step 30 the algorithm discovers that it has reduced the number Y of syncs in cluster 2 to 8, it moves to step 32. Since X=2 is not equal to the total number K of clusters, the algorithm increments cluster number variable X to 3 (step 34) and finds cluster 3 has N=8 syncs (step 30). The algorithm then loops through steps 32, 34 and 30 once again to find that cluster 4 also has the requisite 8 syncs. In a last pass through step 32, finding X=4=K, the K-center algorithm ends having assigned N=8 syncs to each of K=4 clusters.

FIG. 5 depicts the cluster allocation result of the prior art K-center algorithm. Note that areas occupied by clusters 1–4 appear to overlap. For example some cluster 1 and 3 syncs appear to separate cluster 4 syncs 45–47 from the majority of cluster 4 syncs and one cluster 3 sync 43 is somewhat distant from the remaining syncs of cluster 3. Therefore while the K-center algorithm balances the number of syncs in each cluster and generally tends to place nearby syncs in the same cluster, it does not optimize cluster assignment insofar as it allows two or more clusters to occupy overlapping areas of an IC. This means that the syncs within each of those clusters are more widely distributed than they would have to be if they had been differently arranged. The present invention further modifies the cluster arrangement produced by the K-center algorithm to improve cluster assignments by reducing or eliminating cluster overlap, thereby providing clusters having more tightly grouped syncs.

Multipass K-center Algorithm

FIG. 6 is a flow chart illustrating an improved algorithm in accordance with the invention for assigning a set of K×N syncs on an IC into K clusters of N syncs each. The first step (step 50) of the algorithm of FIG. 6 applies the prior art K-center algorithm of FIG. 2 to preliminarily assign the syncs to K clusters as described herein above. In the example case the desired number K of clusters is 4 and the desired number of syncs per cluster is 8, so we apply the K-center algorithm of FIG. 2 with K set equal to 4 and N set equal to 8. Thus FIG. 5 depicts the initial cluster assignment of the example 32-sync IC produced at the end of step 50 of FIG. 6.

Figure 7:
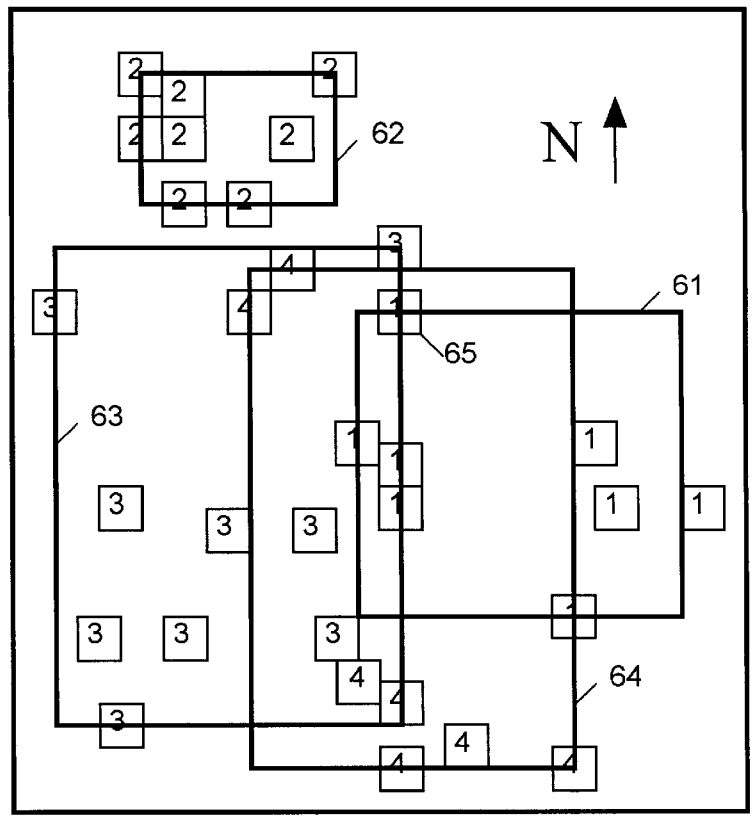

The next step (step 51 of FIG. 6) is to ascertain a rectangular area of the IC's surface that each cluster occupies. To carry out step 51 the algorithm chooses north, south, east and west directions relative to the IC's surface and then identifies a rectangular area for each cluster having north, south, east and west borders. A northern border of each cluster is chosen to lie along an east/west line passing through the center of the northernmost sync of the cluster. For example the northern border of the area 61 occupied by cluster 1 passes through the center of its northernmost sync 65. Similarly the southern, eastern and western borders of each cluster pass though the centers of its southernmost, easternmost and westernmost syncs. FIG. 7 depicts the rectangular areas 61, 62, 63 and 64 occupied by clusters 1–4, respectively, as identified at step 51 of the algorithm of FIG. 6.

The next step (step 52) is to determine whether the areas occupied by any group of clusters overlap. Note from FIG. 7 that while the area 62 occupied by cluster 2 does not overlap any other cluster area, the areas 61, 63 and 64 occupied by clusters 1, 3 and 4 all overlap one another. Had no cluster areas overlapped, the algorithm would have ended at step 53 and all cluster assignments would become permanent. However in this example, since cluster areas, 61, 63 and 64 overlap, the algorithm moves to step 54 where it reapplies the K-center algorithm to each group of overlapping clusters. In this case, where there is one group of three overlapping clusters 1, 3 and 4, the K-center algorithm is re-applied to the syncs included in the overlapping clusters. In the "pass" of the K-center algorithm performed at step 54 the value of N, the number of syncs per cluster remains at 8, but the value of K is set to 3 because in this pass it assigns syncs to only three clusters. Since the area occupied by cluster 2 does not overlap an area occupied by any other cluster, the syncs of cluster 2 are permanently assigned to that cluster and are not included in the second pass of the K-center algorithm.

Figure 8:
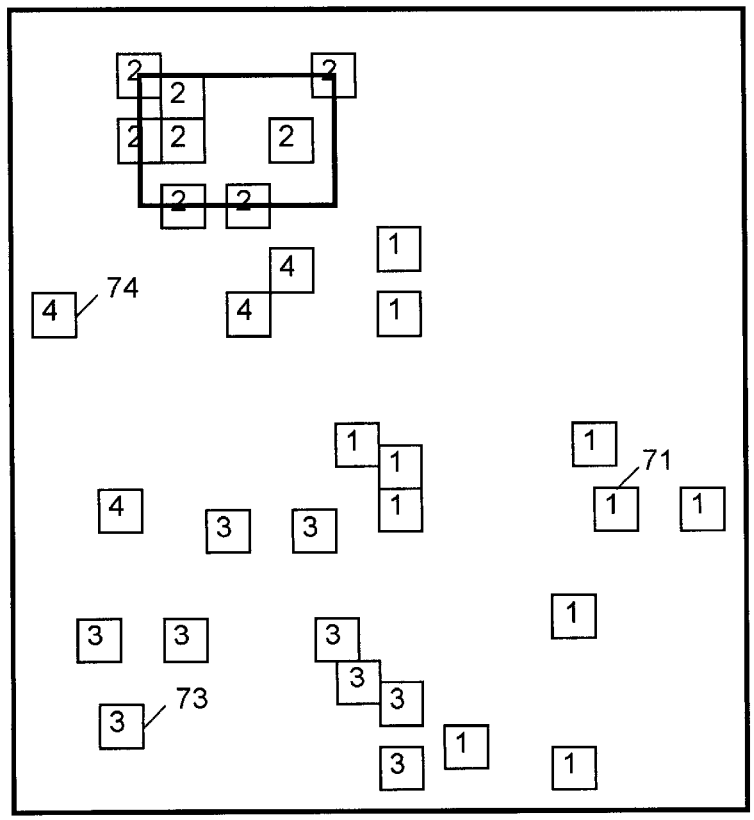

FIG. 8 shows that how the second pass of the K-center algorithm reselects syncs 71, 73 and 74 as centers of "new" clusters 1, 3 and 4 and assigns the remaining syncs to those clusters. Note that the new cluster 1 initially has 11 syncs, new cluster 3 has 9 syncs, and new cluster 4 has only 4 syncs.

Figure 9:
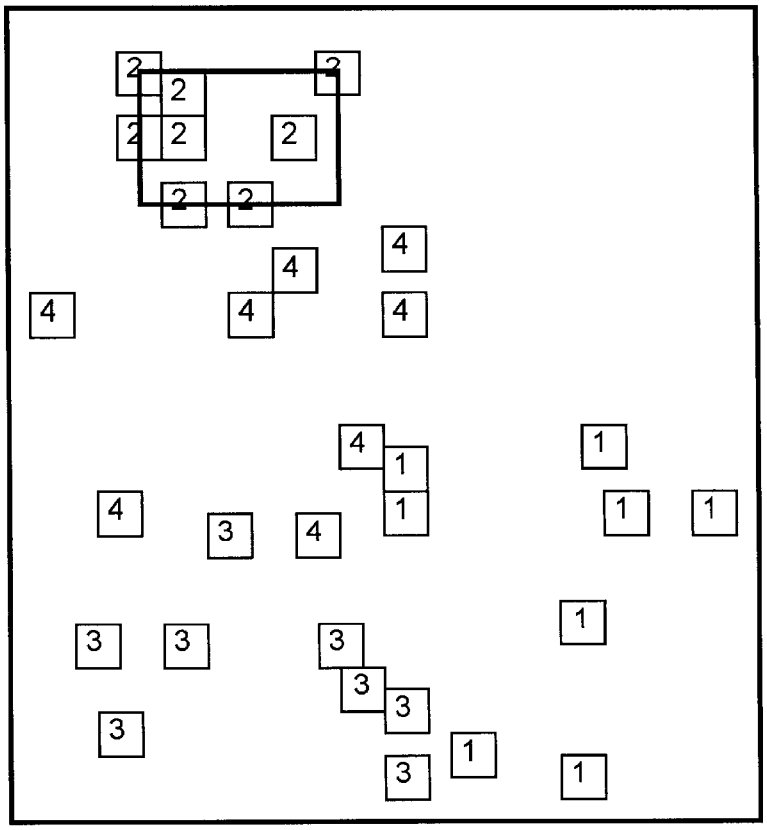

FIG. 9 illustrates the cluster assignment results after the K-center algorithm reassigns the most distant syncs of oversized new cluster 1 of FIG. 8 to undersized neighboring clusters 3 and 4. After the second pass the K-center algorithm produces the new clusters 1, 3 and 4 (step 54) and the borders of the new clusters are then determined (step 55).

Figure 10:
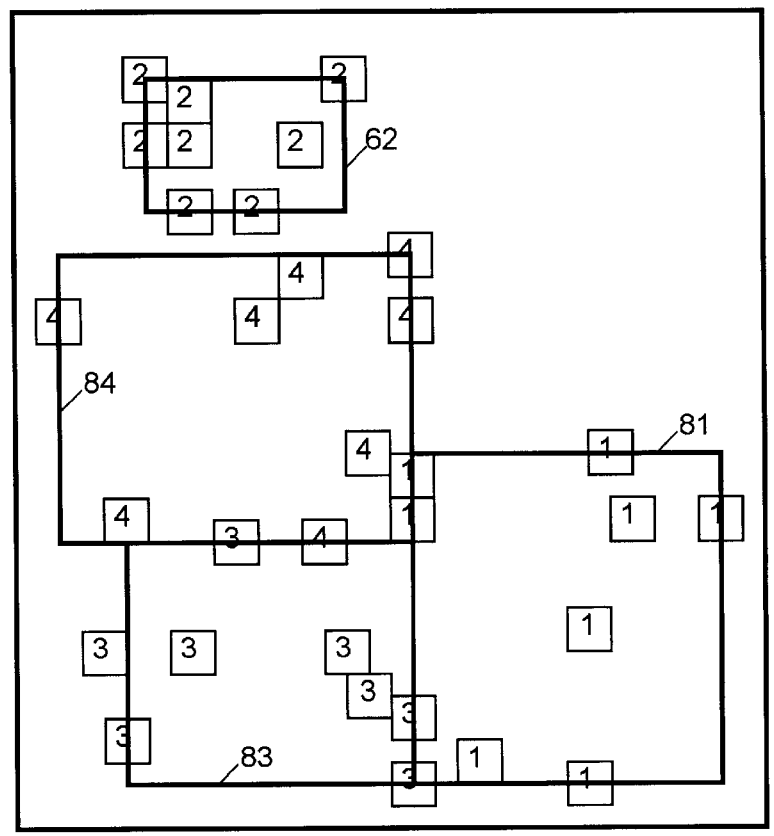

FIG. 10 illustrates the rectangular areas 81, 83 and 84 occupied by new clusters 1, 3 and 4, respectively, as established at step 55. FIG. 10 also shows the area 62 of cluster 2 previously established at step 52. Since none of the cluster areas now overlap (step 56), the algorithm ends at step 57 with the cluster assignments made permanent.

If at step 56, the algorithm had found that a group two or more clusters had continued to overlap, the algorithm (at step 58) checks whether the second application of the K-center algorithm changed (reduced) the number of syncs in the overlapping group. For example if the last application had removed cluster 3 from the group (1, 3 and 4) of clusters last processed at step 54, then the process would return to step 54 to reapply the K-center algorithm to the remaining group of clusters 1 and 4 (K=2) to try to separate the areas occupied by the two clusters. The process continues to iteratively loop through steps 54, 55, 56 and 58 removing clusters from the overlapping groups until it terminates at step 57 with all overlapping groups having been separated, or until it terminates at step 59 having found that the K-center algorithm has been unsuccessful in further separating overlapping clusters.

The cluster assignment resulting from the "multiple pass" application of the K-center algorithm in accordance with the invention will often provide an improvement over the cluster assignment resulting from the prior art "single pass" application of the prior art K-cluster. Note, for example, that the syncs of each cluster appearing in FIG. 10 as a result of application of the improved algorithm are more closely grouped than the syncs of the clusters appearing in FIG. 5 resulting form application of the prior art single pass K-center algorithm. Since the improved method provides tighter grouping of syncs within clusters, the variation in signal path distance from a clock tree buffer providing a CLOCK signal to each sync of a cluster is reduced.

Hierarchical Clustering

As mentioned above, a clock tree may be hierarchical. Clock tree 10 of FIG. 1 is a two level hierarchy because it has two buffer stage 12 and 13. Accordingly syncs 11 are organized into a set of four top level clusters 1–4 each driven by a separate buffer 13. Clusters 1–4 are in turn organized into a set of two lower level clusters A and B, each corresponding to a separate one of two buffers 12. While the simple example clock tree 10 of FIG. 1 has only two levels, clock trees that clock thousands of syncs can have many levels. While, as discussed above, the multipass K-center algorithm illustrated in FIG. 6 can organize syncs 11 into group of clusters 1–4, the algorithm may also be used to organize clusters 1–4 into a lower level set of clusters A and B. To do so, the center of each cluster is treated as if it were a sync.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for clocking a set of K×N integrated circuit (IC) devices ("syncs") of an IC, where K and N are integers greater than one, comprising the steps of:
   (a) preliminarily assigning each sync to one of K clusters, such that each cluster includes N syncs;
   (b) for each cluster ascertaining an area of the IC occupied by the cluster;
   (c) determining whether any group of M clusters occupy overlapping areas, where M is an integer less than K and greater than 1; and
   (d) reassigning a set of M×N syncs included in the group of M clusters to a group of M new clusters each containing N syncs wherein fewer than M of said new clusters have overlapping areas.

2. The method in accordance with claim 1 further comprising the step of
   (e) forming a clock tree in said IC, said clock tree providing a separate clock signal to each cluster, with said clock signal clocking all syncs of the cluster.

3. The method in accordance with claim 1 wherein step (a) comprises the substeps of:
   (a1) assigning each one of K syncs to be a cluster center of separate one of the K clusters;
   (a2) assigning each of said K×N syncs to a cluster of a nearest one of said cluster centers; and
   (a3) reassigning some of the syncs assigned to each cluster having more than N syncs to a cluster of nearest cluster center having less than N syncs.

4. The method in accordance with claim 1 wherein step (b) comprises the substeps of:
   (b1) choosing north, south, east and west directions relative to a surface of said IC;
   (b2) ascertaining a northern boundary of each cluster area as a line passing through a point on said surface of said IC occupied by a northernmost sync of the cluster;
   (b3) ascertaining a southern boundary of each cluster area as a line passing through a point on said surface of said IC occupied by a southernmost sync of the cluster;
   (b4) ascertaining an eastern boundary of each cluster area as a line passing through a point on said surface of said IC occupied by a easternmost sync of the cluster; and
   (b5) ascertaining a western boundary of each cluster area as a line passing through a point on said surface of said IC occupied by a westernmost sync of the cluster.

5. The method in accordance with claim 1 wherein step (d) comprises the substeps of:
   (d1) reassigning M of said M×N syncs to be new cluster centers of separate ones of M new clusters;
   (d2) reassigning each of said M×N syncs to a cluster of a nearest one of said new cluster centers; and
   (d3) reassigning some of the syncs assigned to each of said new clusters having more than N syncs to the new cluster of a nearest cluster center having less than N syncs.

6. A method for clocking a set of K×N integrated circuit (IC) devices ("syncs") of an IC, where K and N are integers greater than one, comprising the steps of:
   (a) preliminarily assigning each sync to one of K clusters, such that each cluster includes N syncs by
      (a1) assigning each one of K syncs to be a cluster center of K separate clusters;
      (a2) assigning each of said K×N syncs to a cluster of a nearest one of said cluster centers; and
      (a3) reassigning some of the syncs assigned to each cluster having more than N syncs to a cluster of a nearest cluster center having less than N syncs;
   (b) for each cluster ascertaining an area of the IC occupied by the cluster by
      (b1) choosing north, south, east and west directions relative to a surface of said IC;
      (b2) ascertaining a northern boundary of each cluster area as a line passing through a point on said surface of said IC occupied by a northernmost sync of the cluster;
      (b3) ascertaining a southern boundary of each cluster area as a line passing through a point on said surface of said IC occupied by a southernmost sync of the cluster;

(b4) ascertaining an eastern boundary of each cluster area as a line passing through a point on said surface of said IC occupied by a easternmost sync of the cluster; and (b5) ascertaining a western boundary of each cluster area as a line passing through a point on said surface of said IC occupied by a westernmost sync of the cluster;

(c) determining whether any group of M clusters occupy overlapping areas, where M is an integer less than K and greater than 1; and (d) reassigning a set of M×N syncs included in the group of M clusters to a group of M new clusters each containing N syncs wherein fewer than M of said clusters have overlapping areas.

7. The method in accordance with claim 6 wherein step (d) comprises the substeps of:

(d1) reassigning M of said M×N syncs to be new cluster centers of separate one of said M new clusters;

(d2) reassigning each of said M×N syncs to a cluster of a nearest one of said new cluster centers; and (d3) reassigning some of the syncs assigned to each of said new clusters having more than N syncs to the new cluster of a nearest cluster center having less than N syncs.

8. The method in accordance with claim 7 further comprising the step of (e) iteratively repeating steps b, c and d.

9. The method in accordance with claim 7 further comprising the step of (e) forming a clock tree in said IC, said clock tree providing a separate clock signal to each cluster, with said clock signal clocking all syncs of the cluster.

10. The method in accordance with claim 7 further comprising the steps of (e) iteratively repeating steps b, c and d; and (f) forming a clock tree in said IC, said clock tree providing a separate clock signal to each cluster, with said clock signal clocking all syncs of the cluster.

* * * * *